United States Patent [19]

Makino et al.

[11] Patent Number: 5,057,337

[45] Date of Patent: Oct. 15, 1991

[54] METHOD AND APPARATUS FOR SOLDER COATING OF LEADS

[75] Inventors: Shinichi Makino; Naokatsu Kojima, both of Shizuoka, Japan

[73] Assignee: Fuji Seiki Machine Works, Ltd., Shizuoka, Japan

[21] Appl. No.: 525,219

[22] Filed: May 16, 1990

Related U.S. Application Data

[63] Continuation of Ser. No. 287,904, Dec. 21, 1988, abandoned.

[30] Foreign Application Priority Data

Dec. 28, 1987 [JP] Japan .................. 62-332874
Dec. 28, 1987 [JP] Japan .................. 62-332875

[51] Int. Cl.⁵ .......................................... C23C 26/00
[52] U.S. Cl. ...................... 427/96; 118/246; 118/248; 118/227
[58] Field of Search ............. 427/96; 118/246, 248, 118/227

[56] References Cited

U.S. PATENT DOCUMENTS

| | | |
|---|---|---|
| 1,654,214 | 12/1927 | Evans . |
| 1,707,611 | 4/1929 | Hamburger et al. . |
| 1,788,610 | 1/1931 | Ashworth et al. . |
| 2,110,893 | 3/1938 | Sendzimir . |
| 2,136,957 | 11/1938 | Sendzimir . |
| 2,588,967 | 3/1952 | Davis . |
| 2,914,423 | 11/1959 | Knapp . |
| 2,935,963 | 5/1960 | Aamot . |
| 3,006,318 | 10/1961 | Monroe et al. . |
| 3,511,680 | 5/1970 | Marcell ............... 118/227 |
| 3,882,816 | 5/1975 | Rooz et al. . |
| 3,958,039 | 5/1976 | Yabuki et al. . |
| 3,968,770 | 7/1976 | Marra ................ 118/227 |
| 3,995,588 | 12/1976 | Booz et al. . |
| 4,250,207 | 2/1981 | Takahashi ............. 118/227 |
| 4,594,962 | 6/1986 | Focke . |
| 4,799,450 | 1/1989 | Cornellier . |
| 4,836,131 | 6/1989 | Kataoka .............. 118/227 |
| 4,858,554 | 8/1989 | Tsuchiya ............. 118/224 |

FOREIGN PATENT DOCUMENTS

| | | |
|---|---|---|
| 526301 | 9/1940 | United Kingdom . |
| 2043024A | 10/1980 | United Kingdom . |
| 2107219 | 4/1983 | United Kingdom .......... 118/227 |

Primary Examiner—Shrive Beck
Assistant Examiner—Vi Duong Dang
Attorney, Agent, or Firm—Flynn, Thiel, Boutell & Tanis

[57] ABSTRACT

A pair of solder coating rolls are disposed horizontally adjacent one another for rotation about parallel horizontal axes, and are spaced apart to define a narrow vertically-oriented nip therebetween for accommodating a lead frame therein. Lower parts of the rolls contact a solder bath, and counter rotation of the rolls carries the solder upwardly on the periphery of the rolls to create a small pool of solder at the upper end of the nip. The lead frame is driven vertically upwardly through the nip, which nip has a minimal dimension greater than the lead frame thickness. The lead frame is driven vertically upwardly at a linear speed which is different from, and preferably slower than, the peripheral speed fo the solder coating rolls. This enables preheating of the surface of the lead frame due to its longer exposure to and contact with the hot solder which coats the periphery of the rolls, thereby improving the wetability of the lead frame surface. At the same time, this upward movement of the lead frame through the nip and through the pool of liquid solder permits a solder coating of high quality and uniformity to be applied to the lead frame.

14 Claims, 4 Drawing Sheets

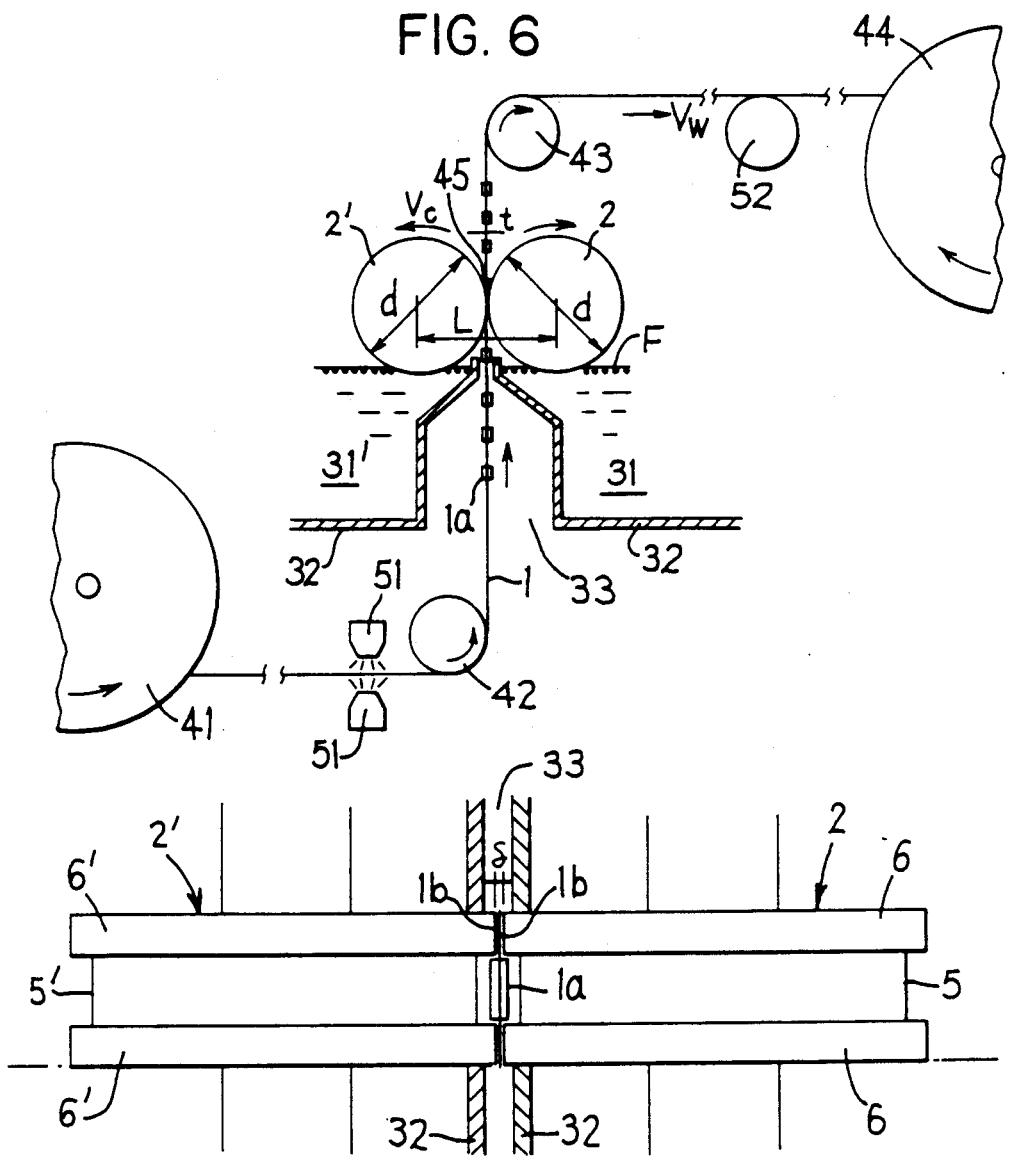

METHOD AND APPARATUS FOR SOLDER COATING OF LEADS

This application is a continuation of U.S. Ser. No. 07/287,904, filed Dec. 21, 1988 now abandoned.

FIELD OF THE INVENTION

This invention relates to a method and apparatus for solder coating leads associated with a lead frame which mounts thereon a plurality of I.C. devices.

BACKGROUND OF THE INVENTION

An I.C. (integrated circuit) device is formed by an I.C. chip capsulated within a resin package, as by a molding operation, and the chip connects to a plurality of pins (generally referred to as "leads") which project outwardly beyond the sides of the resin package. These leads are part of an elongate lead frame such that several such I.C. devices are formed longitudinally in spaced relationship therealong, with the I.C. devices thereafter being severed from the longitudinally extending edge strips of the lead frame.

As is well known, the leads are typically coated with solder, with the coating generally occurring in one of two different ways. In a first common technique, each I.C. device is separated from the lead frame, its leads are then bent downwardly substantially at right angles, and the bent leads are then dipped into a bath of liquid solder. The second conventional technique involves maintaining the plurality of I.C. devices integrally connected to the elongate lead frame so as to define a relatively flat package having a plurality of I.C. devices thereon, with this package in its entirety then being dipped into a bath of liquid solder.

The above techniques are known to possess several disadvantages. In an attempt to improve thereon, the Assignee of this invention developed various apparatus for permitting solder coating of solely the leads while maintaining a plurality of I.C. devices connected to a common elongate lead frame. In one such apparatus, rolls are disposed in pairs vertically disposed one above the other, with the lowermost rolls having their lower parts dipping into a solder bath, and the lead frames are fed horizontally through a narrow nip defined between the vertically-opposed pairs of rolls. With this apparatus, however, only one side of the lead frame can be solder coated at a time, and hence each lead frame has to be reversely oriented and again passed between the pair of rolls to coat the other side. Such is highly inefficient and undesirable.

The Assignee of this invention also developed another apparatus wherein pairs of rolls are disposed in horizontally opposed relationship and lower parts thereof dip into a solder bath. A lead frame is fed vertically through the nip between the rolls to permit simultaneous solder coating of both sides of the lead frame. In this apparatus, the rolls are rotatably driven, and the rolls act either directly on or through the viscous properties of the solder to effect driving of the lead frame through the nip. This arrangement, however, also has proven to possess operational characteristics which are less than optimum.

More specifically, in the solder coating process, an alloy component of the solder material dissipates into the metallurgical structure of the substrate metal, and at the same time metallic molecules of substrate material dissipate into the solder material which has a low melting point. For example, the solder material composed of tin or lead changes to alloys composed of tin or lead and the metal component of the substrate. Accordingly, the substrate metal surface must be heated to a temperature almost equal to the melting point of the solder material during the soldering process, although the amount of heating of the substrate metal surface is obviously different depending upon the type of solder material, the type of substrate metal and the thickness of the substrate metal.

Because of the above, and particularly when using the aforementioned apparatus wherein the lead frame is driven through the nip by the solder coating rolls, optimum soldering conditions often can not be achieved. For example, if the peripheral speed of the roll is too fast, the surface of the lead frame can not be heated to a temperature near that of the melting point of the solder material, whereby the wetability of the surface of the lead frame is insufficient. On the other hand, if the rolls are driven with too slow a peripheral speed, whereby the surface of the lead frame is properly heated so as to have good wetability, nevertheless under this situation the amount of solder material picked up by the rolls and carried upwardly into a pool at the upper end of the nip is decreased and is often not sufficient to create a sufficient coating so as to properly cover the lead frame, particularly where the leads border or join to the resin package.

The lead frame which is to be subjected to the solder coating operation conventionally comprises either a strip type or a ribbon type, each type having the plurality of resin packages mounted at longitudinally spaced intervals therealong. The ribbon-type lead frame is of great length and hence is conventionally stored by being wound on a coil, and for purposes for the present description is referred to as being "substantially continuous" since it does permit a coating operation of long duration to be carried out. The strip-type lead frame, on the other hand, is of a rather short predetermined length having a predetermined number of resin packages mounted in longitudinally spaced intervals thereon, and these strip-type lead frames are sequentially fed through the nip between the solder coating rolls. With the strip-type lead frame, however, it has been observed that excess solder tends to build up at the trailing end of the lead frame and thus creates a small bump or enlargement. This buildup of solder at the trailing end of the strip is undesirable since not only can it sometimes effect the quality of the leads disposed most closely adjacent the trailing end, but it also interferes or complicates further processing and handling of the strips.

Accordingly, the present invention relates to improvements with respect to a method and apparatus for solder coating of leads associated with a plurality I.C. devices as mounted on a common lead frame, which method and apparatus overcome many of the disadvantages associated with known methods and apparatus.

In the improved method and apparatus of this invention, a pair of solder coating rolls are disposed horizontally adjacent one another for rotation about generally parallel horizontal axes, and are slightly spaced apart to define a narrow vertically oriented nip therebetween for accommodating the lead frame therein. The lower parts of these rolls contact a solder bath, and the counter rotation of the rolls carries the solder upwardly on the periphery of the rolls through the nip, thereby creating a small pool of solder at the upper end of the nip. The lead frame is driven vertically upwardly through the nip, and the nip has a minimal dimension which is greater than the lead frame thickness. The lead frame is driven vertically upwardly by a driving device which drives the lead frame at a linear speed which is different from, and preferably slower than, the peripheral speed of the solder coating rolls. This enables a proper preheating of the surface of the lead frame due to its longer exposure to and contact with the hot solder which coats the periphery of the rolls, thereby improving the wetability of the lead frame surface. This upward movement of the lead frame through the nip and through the pool of liquid solder maintained at the upper end of the nip permits a solder coating of high quality and uniformity, and particularly of desired thickness, to be applied to the lead frame and specifically the leads.

Further, in the improved method of this invention, particularly when solder coating strip-type lead frames, the coating rolls and the strip-type lead frame are preferably independently driven at different velocities as the lead frame enters into and passes partially through the nip between the solder coating rolls. However, before the entire length of the strip has passed through the nip, such as after about one-half of the strip length as passed through the nip, then the solder coating rolls are preferably stopped while the strip continues to move upwardly at its predetermined velocity. This hence enables the pool of solder at the upper end of the nip to partially leak downwardly into and through the nip while at the same time effectively coating the remainder of the lead frame as it passes upwardly through the nip as now defined between the stationary rolls. This has been observed to substantially eliminate the bump or buildup of solder material at the trailing end of the lead frame, while at the same time permitting a proper coating of the lead frame.

Other objects and purposes of the invention will be apparent to persons familiar with methods and apparatus of this general type upon reading the following specification and inspecting accompanying drawings.

BRIEF DESCRIPTION OF THE DRAWINGS FIG. 1 is a front view of a preferred embodiment of the solder coating apparatus;

FIG. 6 is a fragmentary side view, partially in cross section, diagrammatically illustrating the vertical upward feeding of a ribbon-type lead frame through the nip;

FIG. 7 is an enlarged plan view of the rolls shown in FIG. 6 for illustrating the relationship of the nip and the lead frame.

DETAILED DESCRIPTION

Figure 4:
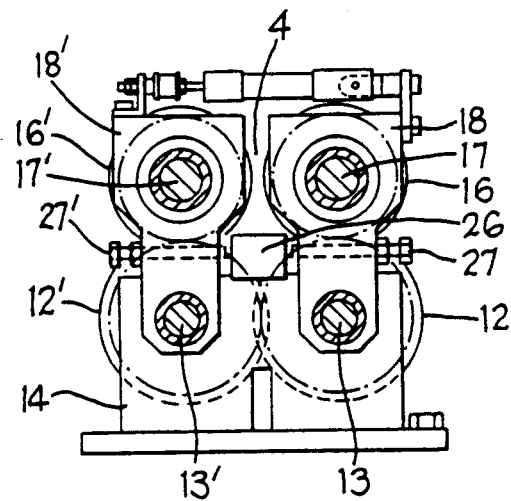
FIG. 4 is a sectional view taken substantially along line B—B in FIG. 2.
Figure 5:
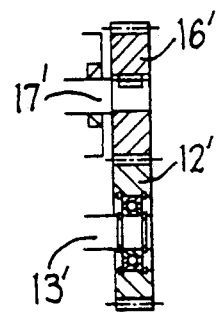
FIG. 5 is a sectional view taken substantially along line C—C in FIG. 2.
Figure 1:
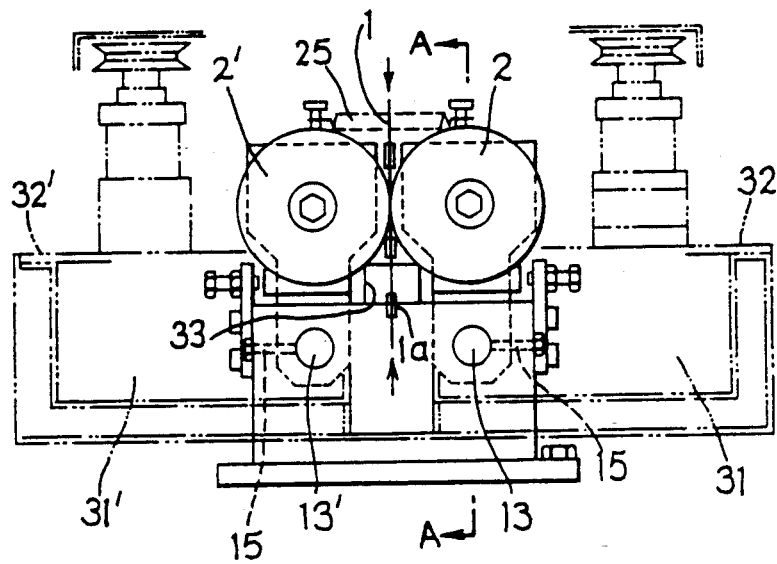
Figure 2:
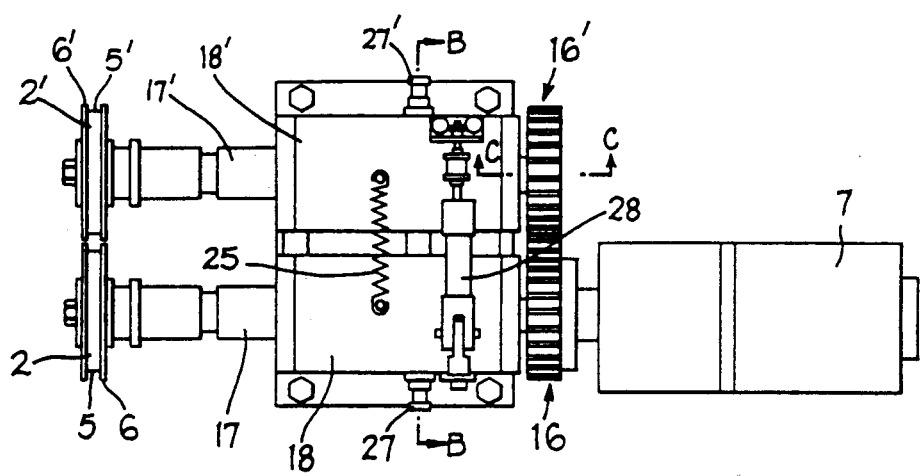
FIG. 2 is a top view thereof.
Figure 3:
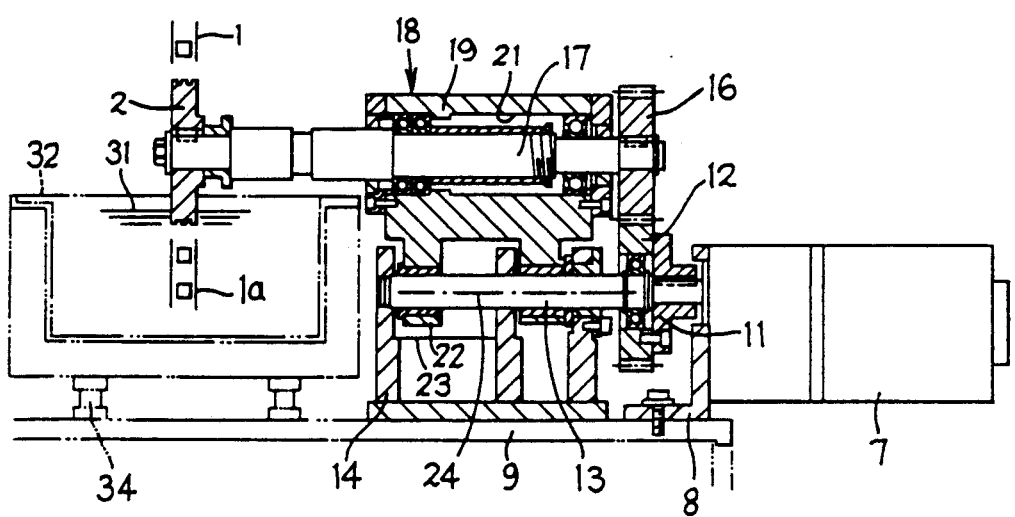
FIG. 3 is a sectional view taken substantially along line A—A in FIG. 1.

FIGS. 1 and 3 diagrammatically illustrate a lead frame 1 which, as is generally conventional, has a plurality of resin packages 1a disposed in spaced relationship longitudinally therealong. Leads project outwardly from opposite sides of the resin package and are joined to elongated edge strips which extend longitudinally along and define the lead frame. The lead frame may comprise either an individual elongate strip of predetermined length having a plurality of resin packages thereon, or an elongate substantially continuous ribbon (or hoop), both types being conventional.

To effect coating of the lead frame, the apparatus includes a pair of rolls 2,2' which are disposed horizontally sidewardly in closely adjacent relationship to define a narrow vertically-extending nip or gap 4 therebetween for accommodating the lead frame 1. The rolls typically have an outer cylindrical profile which includes a recess 5,5' which surrounds the roll and is axially bordered by flanges, which flanges on the outer cylindrical surfaces 6,6' are adapted for effecting solder coating of the leads associated with the lead frame. The recess 5,5' is designed to loosely accommodate the resin package 1a so that the latter will be free of exposure to the molten solder.

To effect rotational driving of the rolls 2,2' in opposite rotational directions, the apparatus includes a drive motor 7 attached to a bracket 8 which is fixed to and projects upwardly from a base or support plate 9, the latter constituting a part of the frame or housing of the apparatus. The drive shaft of motor 7 has a clutch-type coupler 11 secured thereto, and the latter is adapted to be directly drivingly engaged with a driving gear 12 to effect rotation of the latter. This driving gear 12 in turn is directly meshingly engaged with a sidewardly-adjacent driving gear 12'. These gears 12,12' are rotatably supported on the outer ends of generally parallel and horizontally disposed support spindles 13,13', which spindles are nonrotatably secured on spaced upwardly-projecting brackets 14 which are fixed to the base plate. The spindles 13,13' can be suitably nonrotatably fixed relative to the brackets 14 in any conventional manner, such as by locking screws 15,15'.

The driving gears 12,12' in turn respectively directly meshingly engage driven gears 16,16' which are disposed substantially directly over the driving gears. These driven gears 16,16' are slightly sidewardly spaced apart, and in turn are nonrotatably secured to the rearward ends of drive shafts 17,17'. These shafts 17,17' have the rolls 2,2' respectively nonrotatably secured thereto adjacent the forward ends thereof.

The drive shafts 17,17' are respectively rotatably supported on lever-like supports 18,18' which are disposed for individual pivotal movement relative to the housing and relative to one another.

The support 18 at its upper end includes a generally elongate sleeve-like housing part 19 which defines an elongate bore 21 extending therethrough. The drive shaft 17 is rotatably supported within this bore and disposed so as to project outwardly from opposite ends thereof, with the forward end portion of the drive shaft being cantilevered outwardly (leftwardly in FIG. 3) a substantial extent beyond the sleeve part 19. The support 18 also has several downwardly projecting bracket arms 22 provided with appropriate journal bearings 23 which rotatably (i.e, pivotally) mount the support 18 for arcuate swinging movement substantially about the axis 24 of the stationary spindle 13.

The other support 18' is similarly constructed and is supported for swinging movement about the axis of the other stationary spindle 13'.

The supports 18,18' are normally biased to swing inwardly toward one another to cause the rolls 2,2' to approach one another, and for this purpose a biasing means formed as a spring 25 extends between the sleeve parts 19,19' so that the supports are urged in opposite rotational directions toward one another to maintain a minimum nip 4 between the rolls 2,2'.

To adjustably control the width of the nip 4 and the opposed inward approach of the supports 18,18' and drive shafts 17,17' toward one another, there is provided an adjustable stop arrangement. This adjustable stop arrangement includes a stop block 26 which is fixed to the stationary bracket 14 and a pair of adjustable stop members (specifically screws) 27,27' which are respectively threadedly mounted on the supports 18,18' and have the free ends thereof disposed for abutting contact with opposite side surfaces of the stop block 26. With this arrangement, the spring 25 urges the supports 18,18' inwardly toward one another until the screws 27,27' abut opposite sides of the stop block 26 to hence define a desired minimum nip 4 between the solder coating rolls 2,2'.

The sleeve parts 19,19' of the movable supports are also connected by a fluid pressure cylinder 28, the latter having one end of the housing joined to one sleeve part 19 and the free end of the piston joined to the other sleeve part 19'. The cylinder 28 can be rapidly pressurized to effect outward separation between the rolls 2,2' when desired, such as for maintenance or adjustment purposes, or for initial insertion of the lead frame into the nip.

The solder coating apparatus also includes a pair of molten solder baths 31,31' which, in the illustrated embodiment, are defined by separate sidewardly-disposed tank structures 32,32' which have a clearance space 33 therebetween for permitting vertical passage of the lead frame. However, it will be appreciated that the two baths can be united within a single tank so long as the tank has an upwardly opening tunnel or passage therethrough equivalent to the space 33 for permitting passage of the lead frame.

The movable supports 18,18' are swingably supported closely adjacent one side of the molten baths, and the driven shafts 17,17' project in a cantilever fashion outwardly so as to overhang the baths, whereupon the rolls 2,2' are disposed directly over the baths. The elevation of the rolls 2,2' relative to the surface level of the molten solder is such that the lower parts of the rolls 2,2' dip into the molten solder so as to permit solder to be picked up onto the rolls during rotation thereof.

In operation, the lead frame 1 can be either manually or automatically fed into the nip 4 between the rolls 2,2', and in some instances the lead frame, particularly when of an elongated ribbon form, is provided with a dummy leader on the end to facilitate initial feeding into the nip between the rolls. In many instances, the cylinder 28 is activated to separate the rolls 2,2' to facilitate the initial positioning of the lead frame therebetween, following which the cylinder is de-energized so that the spring 25 retracts the rolls until the stop screws 27,27, contact the stop block 26.

The stop screws 27,27' are preferably initially adjusted relative to the stop block 26 so that, due to the urging of the spring 25, the screws normally abut the stop block and maintain a predetermined width of the nip 4 which slightly exceeds the thickness of the lead frame. This predetermined nip width preferably equals the thickness of the lead frame plus twice the desired coating thickness. In this respect, the preferred nip width exceeds the thickness of the lead frame by about 0.03 mm to about 0.08 mm.

During the counter rotation of the rolls 2,2', the rolls dip into the solder baths and then carry solder on the surface of the rolls upwardly into the nip 4 for applying a film coating of solder to opposite sides of the lead frame. By controlling the nip width relative to the lead frame thickness, such as within the range specified above, the solder effectively creates a film on opposite sides of the lead frame and hence effectively maintains the lead frame in a centered relationship between the rolls as it passes through the nip.

The cylinder 28 can also be energized to separate the rolls when excessive solder tends to build up at the upper end of the nip between the rollers.

With the apparatus of the present invention, the leads on the packaged I.C. device can be desirably and simultaneously coated on both sides with melted solder since the lead frame is passed between the opposed solder coating rolls which, due to their lower parts being immersed in the melted solder bath, simultaneously apply a thin film of solder on the opposite surfaces of the leads. The control over the nip between the opposed rolls permits control over the film of solder applied to the leads, thereby achieving desired uniformity of the film to achieve a proper coating of the leads without causing undesired bridging of solder in the gaps between adjacent leads, and without causing application of hot solder to the resin package. Control is further enhanced not only due to the precise adjustability of the nip between the rolls, but also by regulating the roll speed such as due to the adjustability of the speed of the drive motor 7, and by also adjusting the depth of immersion of the rolls into the baths, such as by providing the baths on vertically adjustable legs 39.

Further, the manner in which in the rolls are rotatably driven, coupled with the manner in which the rolls are supported adjacent the outer ends of the cantilever drive shafts, greatly facilitates the manufacture and maintenance of the apparatus, and in particular facilitates the interchangability of the solder coating rolls to accommodate lead frames of different configurations.

Referring now to FIGS. 6 and 7, the present invention will be explained in greater detail, particularly with reference to the solder coating apparatus wherein the lead frame is driven independently of the solder coating rolls, and wherein the lead frame constitutes a substantially continuous or elongate element commonly referred to as a ribbon or hoop.

As illustrated by FIG. 6, the ribbon-like lead frame is arranged so that a section thereof projects generally vertically upwardly through the nip as defined between the pair of opposed solder coating rolls 2,2'. The lead frame is supplied from an uncoiler diagrammatically illustrated at 41 and, after passing through a spraying station 51 which coats the lead frame with a flux, then passes over a lower guide roll 42 for movement upwardly through the passage 33 and thence upwardly through the nip between the solder coating rolls. The lead frame then passes around a further guide roll 43 which is positioned upwardly above the nip, after which the lead frame is then rinsed, cleaned and dried, and is then fed to a conventional coiler as indicated diagrammatically at 44 for winding up of the coated lead frame. The lead frame is moved at a linear velocity or speed $V_W$ which is independent of the rotational peripheral velocity $V_R$ of the rolls 2. For this purpose, the velocity of the lead frame can be controlled by means of a conventional drive which drives the coiler 44. Alternatively, the speed of the lead frame can be controlled by passing the lead frame between a pair of opposed counter-rotating driving rolls, such rolls for example being disposed for driving engagement with the lead frame at a location disposed between the guide roll 43 and the coiler 44.

Typically, the ribbon-type lead frame is provided with a row of small square holes extending longitudinally along one side thereof, which holes engage a driving sprocket or other suitable toothed wheel 52. This driving sprocket 52 is driven from a conventional motor (not shown), and hence effects driving of the lead frame at the desired linear velocity $V_W$. This drive sprocket is normally disposed either at or just upstream of the coiler 44 so as to be disposed substantially at the downstream end of the processing line to effect the desired movement of the ribbon-type lead frame throughout the solder coating process.

The drives for both the lead frame and the solder coating rolls are preferably adjustable, such adjustable speed drives being conventional, to hence permit each to be independently adjusted, and at the same time to permit the relative speeds of the lead frame and solder coating rolls to be adjusted to provide a desired ratio therebetween. The lead frame 1 and rolls 2,2' are preferably moved with different peripheral speeds, and in fact it is preferred that the lead frame be moved at a velocity which is significantly slower than the peripheral velocity of the solder coatings rolls.

The arrangement of FIGS. 6 and 7 was experimentally evaluated. For example, the workpiece velocity $V_W$ was in the range of about 1 to about 2 meters per minute, and the solder coating rolls were rotated so that the peripheral velocity $V_R$ hereof was in the range of from about 3 to about 8 meters per minute. Under these conditions it was determined that the higher speed of the solder coating rolls, and the fact that these rolls continually dip into the solder bath and pick up a layer of hot solder on the periphery thereof, was significant to effect a desirable heating of the lead frame so as to significantly improve the wetability of the lead frame surface. In this manner, the solder coating as applied to opposite sides of the lead frame was of fine quality. At the same time, the quantity of solder material picked up from the bath by the rolls and carried upwardly to the nip was sufficient to create a small pool 45 of solder material at the upper end of the nip. This pool 45 of solder material, through which the lead frame passes upwardly, acts to permit a sufficient coating film to be formed on the lead frame surfaces to such a degree that the film also effectively coats the roots of the leads, that is the point where the leads penetrate into the encapsulated resin package.

In view of the experimental tests, it was indicated that, assuming the center-to-center distance between the rolls 2 and 2' is L, the thickness of the lead frame as defined between the opposed surfaces is t, and d is a diameter of the roll, then $L=d+t+(0.03 \text{ to } 0.08)$ mm is preferably maintained, whereby the spacing between each roll surface and the opposed lead frame surface is maintained between about 0.015 mm and about 0.040 mm. Under such conditions, the rotation of the roll does not hinder or restrict the independent movement of the lead frame through the nip, and at the same time the pool 45 of liquid solder of sufficient quantity is formed between the rolls at the upper end of the nip.

Figure 8:
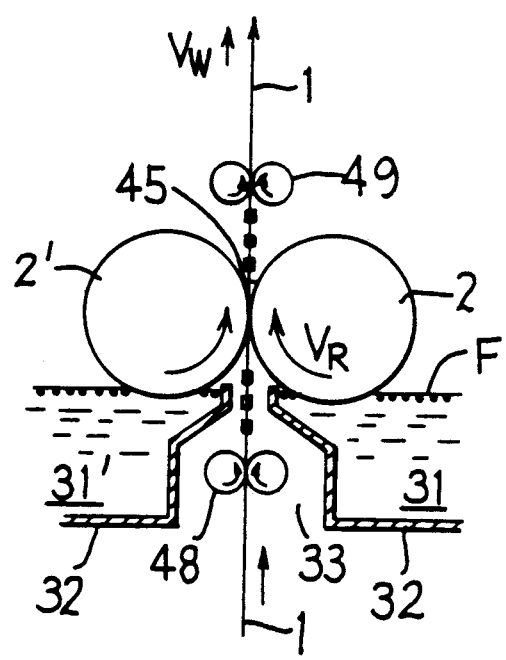
FIG. 8 is a view similar to FIG. 6 but illustrating the independent vertical upward feeding of a strip-type lead frame.

Referring now to FIG. 8 this now illustrates the present invention when applied to a strip-type lead frame, that is, a lead frame having a predetermined and much shorter length. When working with a conventional strip-type lead frame, it is preferably vertically moved and guided upwardly through the nip by being passed between a lower pair of counter-rotating pinch rolls 48 which are spaced downwardly from the nip and guide the lead frame upwardly through the nip. The lead frame then passes between a further pair of counter-rotating pinch rolls 49 which are located upwardly above the nip. At least one, and preferably both, of the pinch rolls sets 48 and 49 are driven by a conventional and preferably adjustable variable speed drive apparatus (not shown) so that the upward linear velocity of the lead frame is different from, and preferably slower than, the peripheral velocity of the solder coating rolls, consistent with the preferred ratios as described above.

When solder coating strip-type lead frames according to the process and apparatus illustrated by FIG. 8, the solder coating rolls 2,2' are driven at a peripheral velocity $V_R$ which is independent of and different from (preferably faster than) the velocity $V_W$ of the strip-type lead frame. These independent and differential velocities $V_R$ and $V_W$ are maintained as the strip-type lead frame is fed into and partially through the nip. However, before the trailing (that is, lower) end of the strip-type lead frame reaches the nip, the drive to the rolls 2,2' is stopped and the rolls preferably held stationary, but the lead frame strip continues to move upwardly at its velocity $V_W$. This stoppage of the rolls 2,2' preferably occurs after about one-half of the lead frame length has passed through the nip. Upon stoppage of the rolls, this thus prevents further solder from being carried upwardly into the pool 45 and, in fact, this pool then tends to lead downwardly into the nip to effectively coat the side surfaces of the lead frame as it continues to move upwardly through the nip. This process has been observed to result in a desirable and proper coating of the lead frame, but at the same time is effective in eliminating the buildup or enlargement of solder material which has been otherwise observed to develop at the lower free end of the strip-type lead frame.

The solder baths are preferably provided with an oxidation preventive compound F floating thereon, the use and purpose of such compound being well recognized.

While the apparatus has been described illustrating the rolls with their lower parts immersed in the liquid solder of the bath, it will be appreciated that the apparatus could be provided with a fountain of liquid solder material disposed adjacent the lower part of each roll so that the roll contacts the crest of the solder fountain to pick up the solder material. In such case, immersion directly into the bath is unnecessary.

As described above, the present method and apparatus is able to create a solder coated film on opposite sides of the lead frame of very high grade or quality. This is due in large part because the wetability of the surfaces to be coated with liquid solder material is significantly increased by properly preheating the lead frame surfaces by passing the lead frame through the nip between the opposed walls of the rolls, which walls are coated with melted solder. To control this preheating, the velocity of the lead frame can be controlled relative to the peripheral velocity of the rolls, and in fact the velocity of the lead frame is preferably less than that of the rolls to provide a longer time during which the lead frame contacts the hot solder film on the rolls so as to achieve proper preheating to thus improve wetability and ultimate solder coating. In addition, the pool of liquid solder material formed at the upper end of the nip between the rolls is increased and maintained with a desirable amount of solder by controlling rotation speed of the rolls, such as by increasing or maintaining the roll speed so as to be greater than the lead frame speed. This pool of liquid solder permits coating of solder material onto the lead frame with an even yet sufficient thickness, and permits coating even t the roots of the leads.

Although a particular preferred embodiment of the invention has been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follows:

1. In a solder coating machine for simultaneously applying thin solder coatings to opposite sides of leads associated with a plurality of I.C. devices as mounted in longitudinally spaced relationship on an elongate lead frame, said machine including frame means, tank means including first and second sidewardly spaced chambers containing a molten liquid solder bath therein and disposed on opposite sides of a narrow vertically extending passage for permitting a lead frame to pass vertically therethrough, the level of the molten solder bath in said compartments being substantially the same and at an elevation slightly below the elevation of the upper end of the passage, first and second supports mounted on said frame means, first and second drive shafts respectively rotatably supported on said first and second supports and respectively defining first and second rotational axes which extend generally horizontally in sidewardly spaced and parallel relationship with one another, first and second solder coating rolls respectively nonrotatably secured to said first and second drive shafts in generally radially aligned and mutually opposed relationship, said first and second rolls being disposed sidewardly closely adjacent but slightly radially spaced from one another to define a narrow nip radially therebetween which is vertically aligned above said passage, said first and second rolls being vertically disposed relative to the chambers so that only the lower portions of said rolls contact the molten solder in the bath, each said roll defining therein a radially inwardly directed recess which extends around the periphery thereof for loosely accommodating therein resin packages associated with the I.C. devices to prevent application of hot molten solder to the resin packages, the improvement comprising first drive means drivingly connected to said first and second rolls for causing simultaneous and synchronized rotation of said drive shafts and of said rolls in opposite rotational directions at a predetermined peripheral speed, said nip having a radial width which is greater than the thickness of the lead frame for permitting the lead frame to pass vertically through said nip without contacting said rolls, and second drive means for drivingly and guidingly moving a lead frame vertically upwardly through said passage and thence through said nip for causing said rolls to apply a thin solder coating to opposite sides of said lead frame, said second drive means causing said lead frame to be moved vertically upwardly at a linear velocity which is independent of and substantially less than the peripheral velocity of said rolls, and said first and second rotational axes lying in a generally horizontal plane which is generally perpendicular to the direction of motion of the lead frame through the nip.

2. A machine according to claim 1, including a supply coil having an elongate and substantially continuous ribbon-type lead frame supported thereon, first and second guide members supported respectively vertically above and below said nip substantially in alignment therewith for vertically guidably moving an elongate portion of said lead frame vertically upwardly through said passage and through said nip, and coiling means for collecting the ribbon-type lead frame after it passes over said first guide member.

3. A machine according to claim 2, wherein said second drive means includes a sprocket-type drive wheel disposed for driving engagement with said ribbon-type lead frame at a location disposed downstream of said nip.

4. A machine according to claim 1, including selectively-energizable cylinder means coupled between said first and second drive shafts for permitting selective movement of said drive shafts outwardly away from one another to permit the solder material between said rolls to be discharged back into the bath.

5. A machine according to claim 1, wherein said nip width is about 0.03 mm to about 0.08 mm greater than the lead frame thickness.

6. A method of simultaneously applying a solder coating to opposite side surfaces of leads which project outwardly from a resin package, said leads and said resin package being joined to an elongate lead frame having a plurality of such leads and resin packages mounted thereon in longitudinally spaced relationship thereaiong, comprising the steps of:

provide a pair of solder-coating rolls supported for rotation about generally parallel horizontal axes with said rolls being disposed with the annular peripheral surfaces thereof in sidewardly closely adjacent and opposed relationship to define a narrow vertically-oriented nip radially therebetween with said nip having a radial width greater than the lead frame thickness for permitting the lead frame to pass vertically through said nip without contacting said rolls;

aligning a generally elongate lead frame section below said nip so that the elongate direction of said section is generally vertically aligned with said nip;

providing a bath of molten solder material in close proximity to but generally below said rolls;

applying molten solder material from said bath solely onto the lower parts of said rolls;

simultaneously rotating said rolls in opposite rotational directions to cause the peripheral surfaces thereof as disposed in directly opposed relationship on opposite sides of the nip to move upwardly and to cause the molten solder material to temporarily coat at least a part of the periphery of said rolls and be carried upwardly into said nip;

rotating said rolls at a predetermined peripheral velocity which, in conjunction with the width of the nip, is sufficient to create a small pool of liquid solder at the upper end of said nip; and moving said lead frame section vertically upwardly into and through said nip and said pool of liquid solder at a linear velocity which is substantially less than the peripheral velocity of said rolls and without substantially contacting said rolls for causing thin layers of molten solder material to coat the opposite sides of said leads.

7. A method according to claim 6, wherein said lead frame is of the strip-type of predetermined length, and said strip-type lead frames are sequentially fed upwardly through said nip.

8. A method according to claim 7, wherein said lead frame comprises an elongate and substantially continuous ribbon-like flexible strip.

9. A method according to claim 8, including the step of spraying flux onto the moving lead frame at a location upstream of the nip.

10. A method according to claim 6, including the steps of:

providing a strip-type lead frame of predetermined length having leading and trailing edges, the strip-type lead frame having a predetermined number of said resin packages mounted thereon in longitudinally spaced relation therealong;

feeding the leading end of said lead frame into the nip at said linear velocity while said rolls are being rotated in opposite rotational directions at said predetermined peripheral velocity;

then stopping the rotation of said rolls after said strip-type lead frame has been linearly moved upwardly so that only a part of the overall length of the lead frame has been moved through the nip; and continuing the upward linear movement of the strip-type lead frame while the rolls are stopped to effect solder coating of the lead frame throughout the complete length thereof.

11. A method according to claim 10, wherein the rotation of the rolls is stopped when about one-half of the length of the strip-type lead frame has been moved through the nip.

12. A method according to claim 6, wherein the peripheral velocity of said rolls is at least about twice the linear velocity of the lead frame.

13. A method according to claim 6, wherein said nip width is about 0.03 mm to about 0.08 mm greater than the lead frame thickness.

14. A method according to claim 13, wherein the peripheral velocity of said rolls is at least about twice the linear velocity of the lead frame, and wherein the nip width is about 0.03 mm to about 0.08 mm greater than the lead frame thickness.

* * * * *

UNITED STATES PATENT AND TRADEMARK OFFICE
CERTIFICATE OF CORRECTION

PATENT NO. : 5 057 337
DATED : October 15, 1991
INVENTOR(S) : Shinichi Makino et al It is certified that error appears in the above-identified patent and that said Letters Patent is hereby corrected as shown below:

Column 11, line 5; change "claim 7," to ---claim 6,---.

Signed and Sealed this

Twenty-fifth Day of May, 1993

Attest:

MICHAEL K. KIRK

Attesting Officer

Acting Commissioner of Patents and Trademarks